United States Patent
Lu et al.

(10) Patent No.: US 7,344,383 B1
(45) Date of Patent: Mar. 18, 2008

(54) SPLIT SOCKET OPTICAL INTERCONNECT

(75) Inventors: Daoqiang Lu, Chandler, AZ (US); Andrew C. Alduino, San Jose, CA (US); Henning Braunisch, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/647,026

(22) Filed: Dec. 27, 2006

(51) Int. Cl.
*H01K 12/00* (2006.01)
(52) U.S. Cl. .................................................. 439/71
(58) Field of Classification Search ............... 439/68, 439/69, 71, 73
See application file for complete search history.

(56) References Cited

U.S. PATENT DOCUMENTS

| | | | |
|---|---|---|---|
| 6,325,552 B1* | 12/2001 | Brillhart ................ | 385/88 |
| 6,347,946 B1 | 2/2002 | Trobough et al. | |
| 6,592,269 B1* | 7/2003 | Brophy et al. ............. | 385/92 |
| 6,637,949 B2* | 10/2003 | Loch et al. ............... | 385/92 |
| 6,815,729 B1* | 11/2004 | Brophy et al. ............. | 257/98 |
| 6,887,109 B2* | 5/2005 | Hofmeister et al. ....... | 439/638 |
| 6,945,712 B1* | 9/2005 | Conn ....................... | 385/94 |
| 6,955,481 B2* | 10/2005 | Colgan et al. ............. | 385/89 |
| 7,008,238 B2* | 3/2006 | Hofmeister et al. ....... | 439/70 |
| 7,084,496 B2* | 8/2006 | Benner et al. ............ | 257/730 |
| 7,168,863 B2* | 1/2007 | Yajima .................... | 385/92 |
| 7,195,401 B2* | 3/2007 | Moll et al. ................ | 385/88 |
| 2001/0000763 A1* | 5/2001 | Muramatsu .............. | 439/74 |
| 2005/0058408 A1* | 3/2005 | Colgan et al. ............. | 385/89 |
| 2005/0064743 A1* | 3/2005 | Hofmeister et al. ....... | 439/70 |
| 2005/0286239 A1 | 12/2005 | Trobough | |
| 2005/0287837 A1 | 12/2005 | Trobough | |
| 2006/0078248 A1* | 4/2006 | Sasaki et al. ............. | 385/14 |
| 2006/0105607 A1* | 5/2006 | Hougham et al. ......... | 439/330 |
| 2006/0159405 A1* | 7/2006 | Yajima .................... | 385/88 |
| 2006/0182397 A1* | 8/2006 | Benner et al. ............ | 385/89 |
| 2006/0291784 A1* | 12/2006 | Wang et al. .............. | 385/92 |

OTHER PUBLICATIONS

Henning Braunisch et al., Flex-Circuit Chip-to-Chip Interconnects, 2006 Electronic Components and Technology Conference, 2006 IEEE, pp. 1853-1859.

* cited by examiner

*Primary Examiner*—Ross Gushi
(74) *Attorney, Agent, or Firm*—Kevin A. Reif

(57) ABSTRACT

A split microprocessor socket is disclosed that provides a cavity created at an outer edge of the microprocessor socket. An optical module may be fitted in the cavity thus providing an optical fiber or waveguide connection directly to the socket. This low cost optical interconnect, closely packaged with the microprocessor, may alleviate bandwidth constraints associated with conventional electrical connections.

17 Claims, 4 Drawing Sheets

SPLIT SOCKET OPTICAL INTERCONNECT

FIELD OF THE INVENTION

Embodiments of the present invention relate to sockets and, more particularly, to microprocessor sockets having an optical interconnect.

BACKGROUND INFORMATION

Since the introduction of the Personal Computer (PC), the microprocessor has interfaced with the system motherboard through a socket. The role of the socket is to provide electrical connectivity between the microprocessor and the motherboard, while also allowing tool-free installation, removal and interchangeability of the microprocessor without damage.

As microprocessor speeds have continued to increase, socket requirements are becoming more challenging. Power consumption continues to trend upward, driven by the increased leakage current of smaller silicon features, the increased dynamic current required to scale frequency, and the incorporation of multiple cores within a single package. At the same time, the required socket bandwidth to support the necessary high-speed signaling is also increasing rapidly.

Many microprocessor sockets used today are built around the pin grid array (PGA) architecture. Here, pins on the underside of the processor are inserted into the socket, usually with zero insertion force (ZIF). Newer socket designs use a land grid array (LGA) in which the pins are on the socket side instead and come in contact with pads on the processor. Thus, power and electrical signals may pass between the microprocessor and the motherboard via the socket.

Electrical interconnects may have their limitations. For example, currently planned electrical implementations of the common system interface (CSI) protocol links may be limited in the bandwidth distance product even at 6.4 gigabits/second (Gb/s). Among other things, CSI allows microprocessor cores to communicate with one another directly. The limitation imposed by the inadequate bandwidth distance product of electrical channels based on commercially available components and materials is currently solved by reducing the distance of the microprocessors in the multi-processor system or limiting system bandwidth. This is an unsustainable trend, however, and a better solution is desirable.

DETAILED DESCRIPTION

A low cost optical interconnect, closely packaged with the microprocessor, may alleviate electrical system constraints due to the improved channel bandwidth provided by optical interconnects. A split socket is disclosed that provides at least one cavity created at an outer edge of the microprocessor socket. An optical module may be fitted in the cavity thus providing an optical fiber or waveguide connection directly to the socket.

Figure 1:
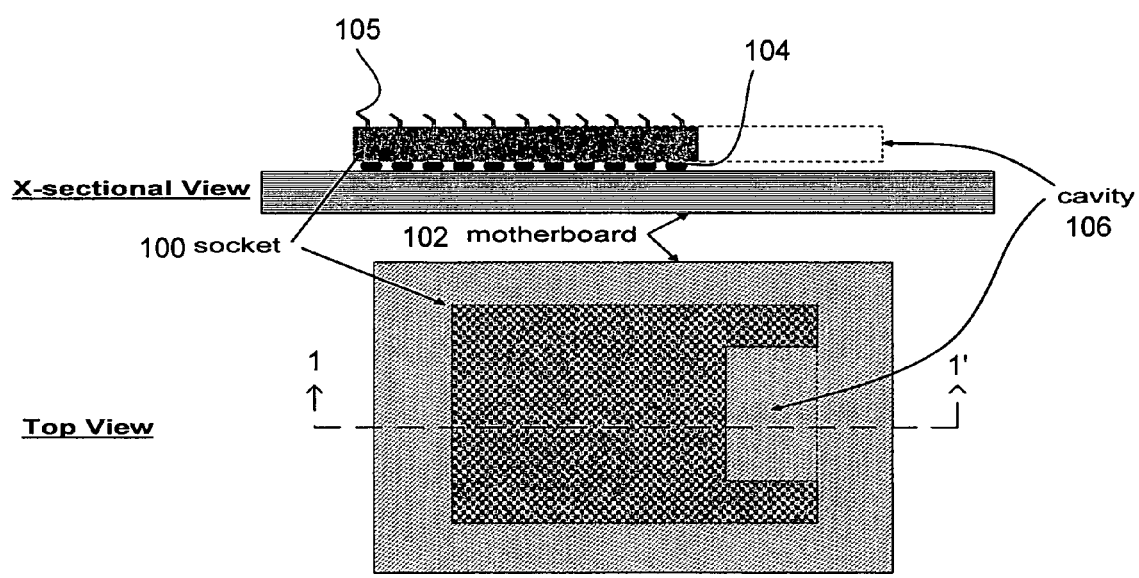
FIG. 1 is a top view and cross sectional view of a microprocessor split socket according to one embodiment.

Referring now to FIG. 1, there is shown a top view and a cross-sectional view taken along line 1-1' of a socket according to embodiments of the invention. A socket 100 is mounted to a motherboard 102. Electrical and/or mechanical connections may be provided between the two by solder balls 104 or any suitable method. Pins 105 may be provided for later connection with a microprocessor package. A cavity 106 may be formed at one edge of the socket 100. The cavity 106 may be sized to accommodate, for example, an optical module. The cavity 106 is illustrated as being generally rectangular in shape, but may be formed with different shape or dimensions depending on the size of the module it is to accommodate.

In this example, an approximately 4.2 mm deep cavity 106 is created at the outer edge of the microprocessor socket 100. This cavity may be formed by precision molding when the socket body 100 is made. The design of the cavity side walls may be used to enable the lateral alignment of the optical module with the LGA microprocessor package.

FIGS. 2-6 show various embodiments of the invention. Like items are labeled with like reference numerals as previously discussed with reference to FIGS. 1 and 2 and not necessarily described again to avoid repetition.

Figure 2:
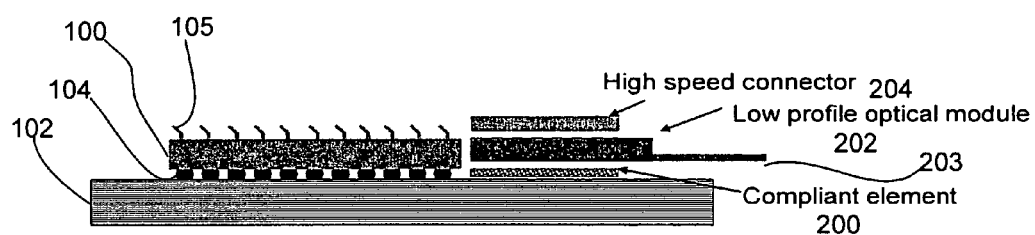
FIG. 2 is a cross sectional view of a microprocessor split socket including an optical module fitted into a cavity.

As shown in FIG. 2, a compliant element 200 (such as an elastomer), an optical module 202, an optical waveguide array or fiber array 203, and a high density, high speed connector 204 may be fitted into the cavity 106. The high speed connector 204 may be a double compression cLGA® connector (e.g. from Amphenol InterCon Systems®), or RP-type inter-connector (i.e. a low compression load connector, for example manufactured by Shin-Etsu®, comprising an array of conductive elastomeric pins held in place by a polyimide film).

Figure 3:
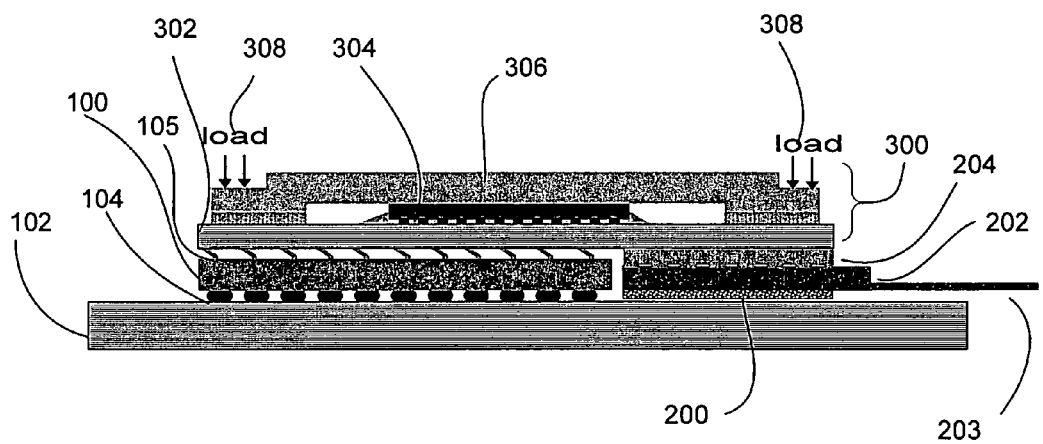
FIG. 3 is a cross sectional view of a microprocessor split socket with a microprocessor package.

As shown in FIG. 3, a microprocessor package 300 may comprise a substrate 302 and an integrated heat spreader (IHS) 306 housing a microprocessor die 304. The microprocessor package 300 may be placed in the socket 100 and then a socket lid (not shown) closed to apply load 308 onto IHS 306 and thus the microprocessor package 300. Electrical signals may be transmitted through contact made between the "top" of the optical module 202 and the bottom (land side) of the microprocessor package 300.

The optical module 202 should have a low vertical profile (approx. 1-2 mm inside the microprocessor package shadow). The optical module 202 does not need to be laterally confined to the shadow of the microprocessor package 300. The optical module 202 may "stick out" from under the microprocessor package 300, for example, to make room for electronic/optoelectronic components inside the optical module 202. In that case, a low vertical profile would be maintained inside the microprocessor shadow, but not necessarily outside.

The optical module 202 is not limited in technology by this implementation, allowing for modular upgrade of the optical performance, and cost and performance improvements over time. In one implementation the optical module could be a Silicon Optical Bench with thru-vias and a silicon cap.

Power delivery to the low profile optical module 202 may be accomplished in several ways. Three potential options are offered with reference to FIGS. 4-6.

Figure 4:
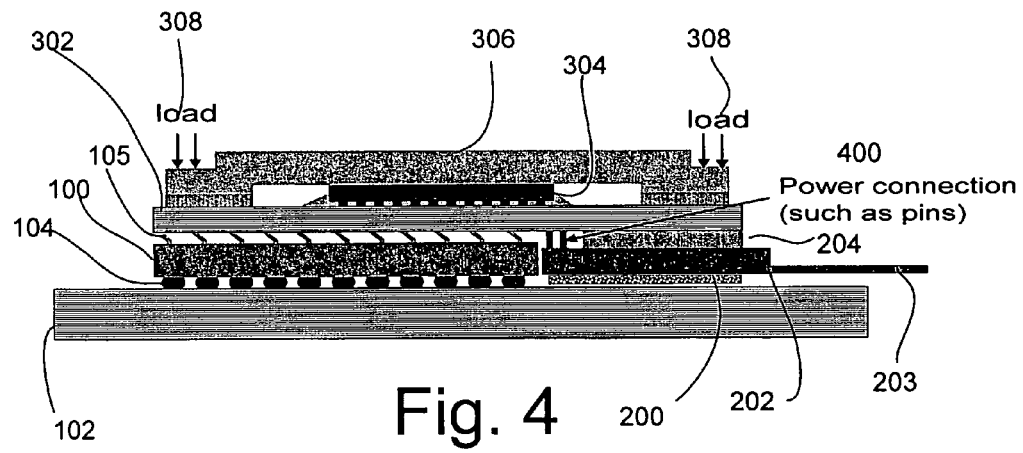
FIG. 4 is a cross sectional view of a microprocessor split socket having power connection pins at the interface between the microprocessor package and the optical module.

As shown in FIG. 4, pins 400 or similar electrical contacts may be provided from the package 300 through the high speed connector 204. Electrical power may be routed from the motherboard 102 through the socket 100 and the package 300 and then into the optical module 202 through the pins 400.

Figure 5:
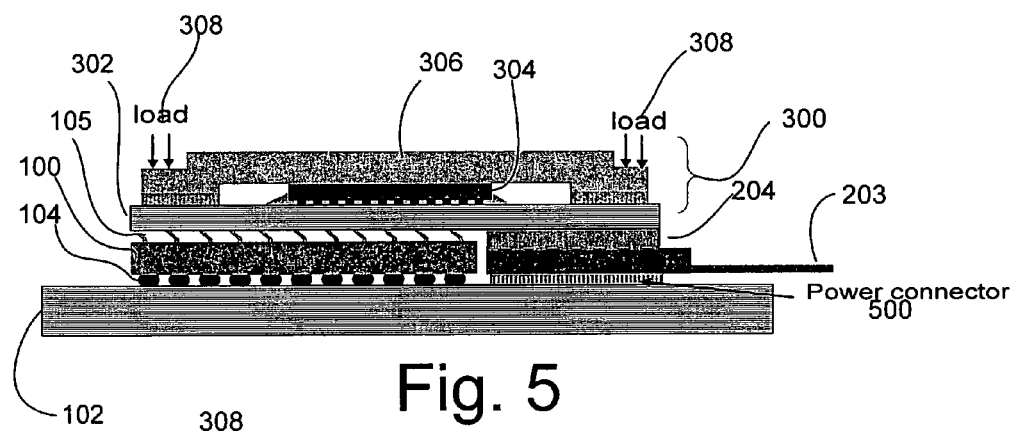
FIG. 5 is a cross sectional view of a microprocessor split socket having a power connector beneath the optical module.

As shown in FIG. 5, power may be provided directly from the motherboard 102 to the "bottom" of the optical module 202, by replacing the compliant element 200 (FIG. 2) with a connector 500, potentially also having some compliance.

Figure 6:
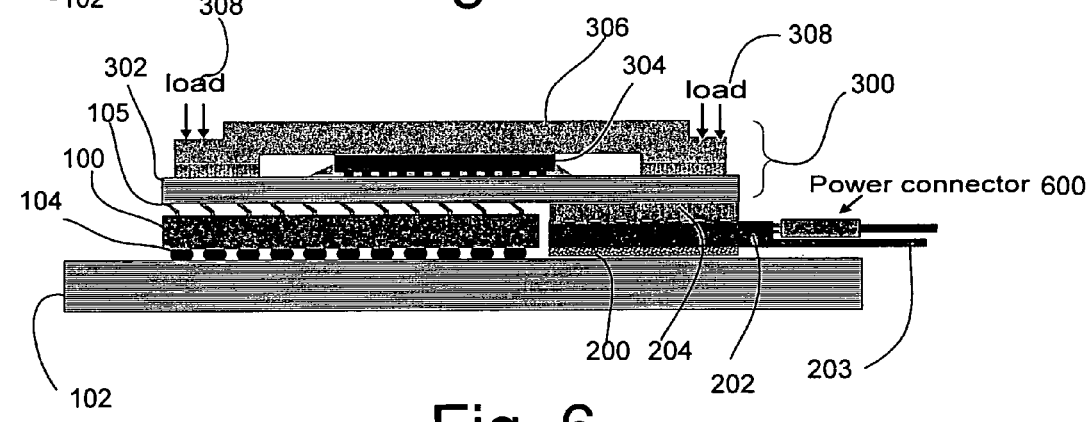
FIG. 6 is a cross sectional view of a microprocessor split socket having a lateral power connector.

In an alternate arrangement, as shown in FIG. 6, power may be provided through a lateral power connector 600 at the edge of the optical module 202, potentially with a pluggable connector 600 integrated into the optical module 202.

Figure 7:
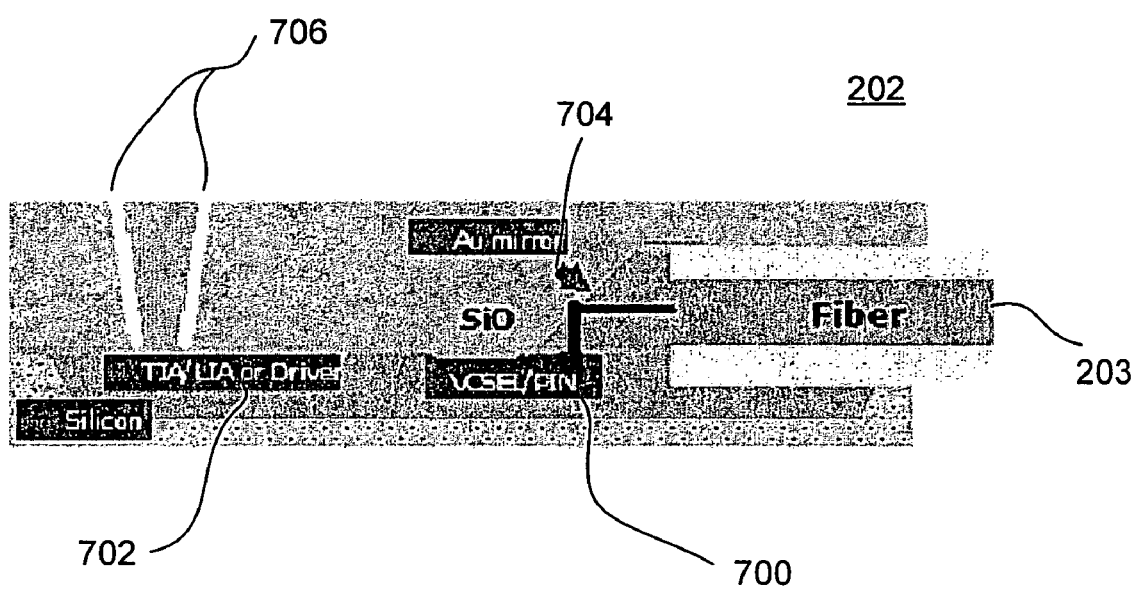
FIG. 7 is an example of an optical module compatible with the split socket design according to one embodiment.

Referring to FIG. 7, there is shown one example of an optical module 202. Of course the term optical module 202 is also meant to encompass optoelectronic modules since typically both optical and electronic components are included in the module. A low profile optical module 202 may be created using Silicon Optical Bench technology as shown. A fiber 203 may be aligned with a mirror 704 to guide light to or from electronics, such as vertical cavity surface emitting laser or PIN diode 700. Other electronics common to optical packages such as a transimpedance amplifier (TIA)/Limiting Input Amplifier (LIA) or drivers 702 may also be included. Vias 706 may be provided to allow electrical connections to the electronics 702.

The electronics may be integrated into the module or provided externally, potentially in the packaged microprocessor for instance. The optical components could also be different than those shown. For example, edge emitting lasers or waveguide based modulators may also provide the same functionality.

A low cost optical interconnect such as that described may have great advantages over the current remedies for link length reduction. It may allow those users who require greater performance to purchase the performance with only a small increase in complexity, even choosing to upgrade the performance at a later date by simply changing the socket on the board. The bandwidth distance product increase would allow the creation of novel system architectures because the achievable distance at a given bandwidth may jump dramatically (from approx. 0.5 meters to approx. 30 meters).

Although the proposed implementation is directed to microprocessor sockets, it may be easily used for non-microprocessor integrated circuits (ICs), such as input/output (I/O) hub devices or chip set solutions.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a socket to connect an electronic package to a board;
   a cavity formed at an edge of the socket; and
   an optical module fitted within the cavity, the optical module to provide an optical connection to the socket.

2. The apparatus as recited in claim 1 wherein the socket comprises a land grid array (LGA) socket.

3. The apparatus as recited in claim 1 further comprising:
   a high speed connector to provide an electrical connection between the optical module and the electronic package; and
   a compliant element between the board and the optical module.

4. The apparatus as recited in claim 1 further comprising:
   power connection pins to connect the electronic package and the optical module.

5. The apparatus as recited in claim 1 further comprising:
   a lateral power connection to supply power to the optical module.

6. The apparatus as recited in claim 1 wherein the board comprises a motherboard and the electronic package comprises a microprocessor package.

7. The apparatus as recited in claim 1 further comprising:
   a power connector positioned on the board beneath the optical module.

8. The apparatus as recited in claim 7 wherein the power connector has compliant properties.

9. A method, comprising:
   forming a cavity in an edge of a microprocessor package socket;
   fitting an optical module within the cavity;
   mounting a microprocessor package to the socket; and
   applying a mechanical load to a top of the microprocessor package.

10. The method as recited in claim 9 further comprising:
    attaching the socket to a motherboard.

11. The method as recited in claim 10, further comprising:
    placing a compliant element between the optical module and the motherboard.

12. The method as recited in claim 11, further comprising:
    placing a high speed connector between the optical module and the microprocessor package.

13. A system to provide an optical connection to a socket, comprising;
    a motherboard;
    a socket connected to the motherboard, the socket having a split created on one or more edges to form a cavity;
    an optical module fitted within the cavity to provide an optical connection to the socket; and
    a microprocessor package mounted on the socket.

14. The system as recited in claim 13 further comprising:
    power connection pins to connect the microprocessor package and the optical module.

15. The apparatus as recited in claim 13 further comprising:
    a lateral power connection to supply power to the optical module.

16. The apparatus as recited in claim 13 further comprising:
    a power connector positioned on the motherboard beneath the optical module.

17. The apparatus as recited in claim 16 wherein the power connector has compliant properties.

* * * * *